United States Patent
Xie et al.

(10) Patent No.: US 12,185,556 B2
(45) Date of Patent: Dec. 31, 2024

(54) SOLAR CELL AND PHOTOVOLTAIC MODULE

(71) Applicant: LONGI GREEN ENERGY TECHNOLOGY CO., LTD., Shaanxi (CN)

(72) Inventors: Junjie Xie, Shaanxi (CN); Chen Xu, Shaanxi (CN); Zifeng Li, Shaanxi (CN); Zhao Wu, Shaanxi (CN); Jinling Jin, Shaanxi (CN); Tong Liu, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 0 days.

(21) Appl. No.: 18/272,027

(22) PCT Filed: Nov. 23, 2021

(86) PCT No.: PCT/CN2021/132489
§ 371 (c)(1),
(2) Date: Jul. 12, 2023

(87) PCT Pub. No.: WO2022/183784
PCT Pub. Date: Sep. 9, 2022

(65) Prior Publication Data
US 2024/0090245 A1 Mar. 14, 2024

(30) Foreign Application Priority Data

Mar. 3, 2021 (CN) .......................... 202110236194.5

(51) Int. Cl.
H10K 30/40 (2023.01)
H10K 39/10 (2023.01)

(52) U.S. Cl.
CPC ............ *H10K 30/40* (2023.02); *H10K 39/10* (2023.02)

(58) Field of Classification Search
CPC .............................. H10K 30/40; H10K 39/10
See application file for complete search history.

(56) References Cited

U.S. PATENT DOCUMENTS

2020/0203633 A1   6/2020   Qin et al.

FOREIGN PATENT DOCUMENTS

| CN | 108321296 | 7/2018 |
|---|---|---|
| CN | 108336249 | 7/2018 |

(Continued)

OTHER PUBLICATIONS

Zhang et al. ("Stable and Efficient 3D-2D Perovskite-Perovskite Planar Heterojunction Solar Cell without Organic Hole Transport Layer"). Joule 2, 2706-2721, Dec. 2018. (Year: 2018).*

(Continued)

*Primary Examiner* — Lindsey A Buck
(74) *Attorney, Agent, or Firm* — NIXON PEABODY LLP; Jeffrey L. Costellia

(57) ABSTRACT

The present disclosure relates to the field of photovoltaic technologies. Disclosed are a solar cell and a photovoltaic module. The solar cell includes: an absorption layer; and an energy selective contact layer located on a surface of the absorption layer, the energy selective contact layer having selectivity for electron energy or hole energy, and the material of the energy selective contact layer including a low-dimensional perovskite material. According to the solar cell and the photovoltaic module provided by the present disclosure, a photovoltaic module can be manufactured.

13 Claims, 2 Drawing Sheets

(56) References Cited

FOREIGN PATENT DOCUMENTS

| | | |
|---|---|---|
| CN | 109768162 | 5/2019 |
| CN | 111403609 | 7/2020 |
| CN | 112002813 | 11/2020 |

OTHER PUBLICATIONS

Chen et al. "In situ growth of 2D perovskite capping layer for stable and efficient perovskite solar cells." Advanced Functional Materials, vol. 28, No. 17: 1706923, Feb. 2018.

Quan et al. "Ligand-stabilized reduced-dimensionality perovskites." Journal of the American Chemical Society, vol. 138, No. 8: 2649-2655, Feb. 2016.

Zardari et al. "p-Phenylenediaminium iodide capping agent enabled self-healing perovskite solar cell." Scientific Reports, vol. 10, No. 1: 20011, Nov. 2020.

Koh et al. "Enhancing moisture tolerance in efficient hybrid 3D/2D perovskite photovoltaics." Journal of Materials Chemistry A, vol. 6, No. 5: 2122-2128, Jan. 2018.

Fan et al. "Review of stability enhancement for formamidinium-based perovskites", Solar RRL, vol. 3, No. 9: 1900215, Aug. 2019.

Cohen et al. "Mutations in M2 alter the selectivity of the mouse nicotinic acetylcholine receptor for organic and alkali metal cations", The Journal of general physiology, vol. 100, No. 3: 373-400, Sep. 1992.

Kahmann et al. "Hot carrier solar cells and the potential of perovskites for breaking the Shockley-Queisser limit", Journal of Materials Chemistry C vol. 7, No. 9: 2471-2486, Jan. 2019.

Extended European Search Report for App. No. 21928856.0, dated May 27, 2024 (13 Pages).

International Search Report for Application No. PCT/CN2021/132489, mailed Feb. 28, 2022 (4 pages).

* cited by examiner

SOLAR CELL AND PHOTOVOLTAIC MODULE

CROSS-REFERENCE TO RELATED APPLICATION

The present application claims priority to Chinese patent application No. 202110236194.5, titled "SOLAR CELL AND PHOTOVOLTAIC MODULE", filed with the China National Intellectual Property Administration on Mar. 3, 2021, the entire contents thereof are incorporated herein by reference.

TECHNICAL FIELD

The present disclosure relates to the field of photovoltaic technology, in particular to a solar cell and a photovoltaic module.

BACKGROUND

In a solar cell, especially a hot carrier solar cell, an energy selective contact layer can be used to selectively transport carriers generated in an absorption layer and export them to an external circuit.

In the related art, the energy selective contact layer is generally formed by providing quantum dots of metal or semiconductor materials in a dielectric material. However, such an energy selective contact layer is difficult to be manufactured.

SUMMARY

An object of the present disclosure is to provide a solar cell and a photovoltaic module.

In a first aspect, the present disclosure provides a solar cell, including: an absorption layer; and an energy selective contact layer disposed on a surface of the absorption layer, the energy selective contact layer having a selectivity for electron energy or hole energy; a material of the energy selective contact layer includes a low-dimensional perovskite material.

When the above technical solution is adopted, the material of the energy selective contact layer includes a low-dimensional perovskite material. The low-dimensional perovskite material is obtained by introducing spacer cations into the three-dimensional perovskite structure, so that the spacer cations confine the octahedral structure to a smaller space, thereby reducing the dimensionality of the perovskite material. In this way, the low-dimensional perovskite lattice of the low-dimensional perovskite material has energy level splitting in its valence band and conduction band, and can be used as the quantum layer of the energy selective contact layer. Spacer cations of the low-dimensional perovskite materials can be served as a barrier layer for the energy selective contact layer. In this case, such low-dimensional perovskite material is used to form a thin film of a single material, through which an energy selective contact layer with a resonant tunneling structure can be fabricated. The energy selective contact layer with two functions is formed without the cooperation of other materials.

In some embodiments, a general chemical formula of the low-dimensional perovskite material is $LmA_{(n-1)}B_nX_{(3n+m-1)}$, L is a spacer cation, A and B are both cations, X is an anion, and m is 2, 3 or 4, n is an integer greater than or equal to 1; an ionic radius of the spacer cation L is greater than the ionic radius of a cesium ion. In this case, the ionic radius of the spacer cation L is relatively large.

In some embodiments, the ionic radius of the spacer cation L is greater than or equal to 200 pm.

In some embodiments, the spacer cation L is an organic cation, and the organic cation includes one or more of an aromatic amine ion, a guanidine ion, and a long chain amine ion with a carbon number greater than or equal to 3.

In some embodiments, the aromatic amine ion includes one or more of a phenethylamine ion, an anilinium ion, and a m-phenylenediamine ion In some embodiments, the long chain amine ion has a carbon chain length of 4~20 carbon atoms.

In some embodiments, the long chain amine ion includes one or more of a n-butylamine ion and a n-octylamine ion.

In some embodiments, $1 \leq n \leq 5$. The value of n is positively related to the number of $[BX_6]^4$-structural units in the low-dimensional perovskite lattice.

In some embodiments, 'A' is one or more of a methylamine ion, a formamidine ion, and $Cs^+$ ion; 'B' is a divalent metal ion; 'X' is a halogen ion.

In some embodiments, the material of the absorption layer is crystalline silicon, perovskite, III-V semiconductor material or organic material. Accordingly, the solar cell may be a crystalline silicon solar cell, a perovskite solar cell, or the like.

In some embodiments, the energy selective contact layer has a thickness of 10 nm to 200 nm.

In some embodiments, the solar cell includes two energy selective contact layers. The two energy selective contact layers are an electron energy selective contact layer and a hole energy selective contact layer respectively.

In some embodiments, the energy selective contact layer is manufactured through a coating process or a printing process.

In a second aspect, the present disclosure provides a photovoltaic module. The photovoltaic module includes the solar cell described in the first aspect or any possible implementation manner of the first aspect.

BRIEF DESCRIPTION OF THE DRAWINGS

The drawings described here are used to provide a further understanding of the present disclosure, and constitute a part of the present disclosure. The schematic embodiments of the present disclosure and descriptions thereof are used to explain the present disclosure, and do not constitute improper limitations to the present disclosure. In the drawings.

DETAILED DESCRIPTION OF THE EMBODIMENTS

Figure 1:
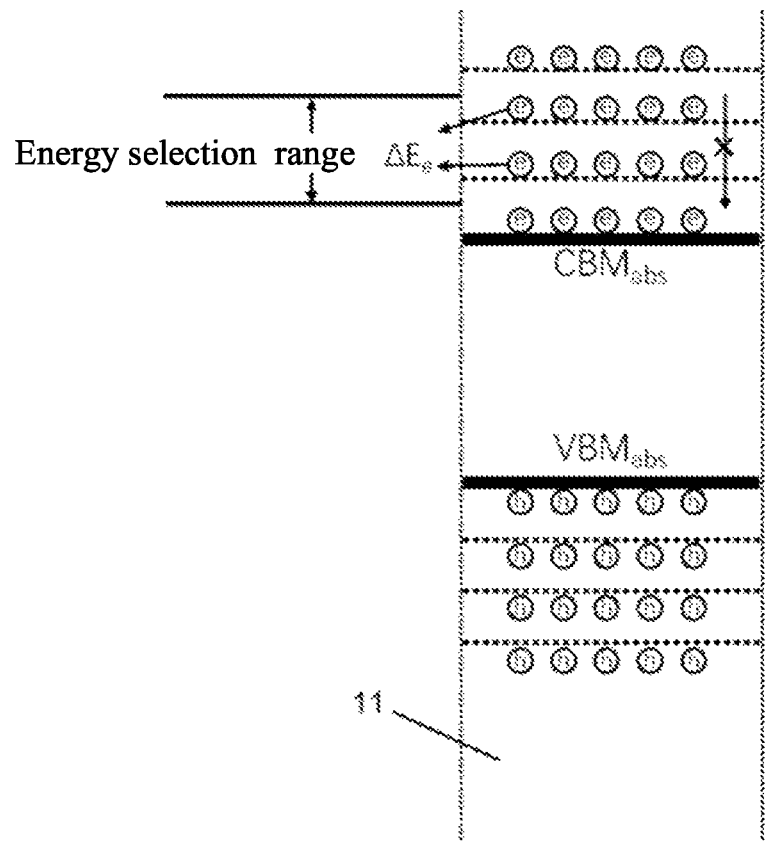
FIG. 1 is a schematic diagram illustrating hot electron energy selective contact.

In order to clearly describe technical solutions of embodiments of the present disclosure, in the embodiments of the present disclosure, words such as "first" and "second" are used to distinguish same or similar items with basically the same function and effect. Those skilled in the art can understand that words such as "first" and "second" do not limit the quantity and execution order, and words such as "first" and "second" do not necessarily mean that the items are different.

In the description of the present disclosure, it should be understood that orientation or positional relationships indicated by terms "upper", "lower", "front", "rear", "left", "right" etc. are based on those shown in the accompanying drawings. The orientation or positional relationships are only for the convenience of describing the present disclosure and simplifying the description, and do not indicate or imply that the referred device or element must have a specific orientation, be constructed and operated in a specific orientation, and thus cannot be construed as limiting the present disclosure.

It should be noted that, in the present disclosure, words such as "exemplary" or "for example" are used as examples, embodiments or illustrations. Any embodiment or design described in this disclosure as "exemplary" or "for example" is not to be construed as preferred or advantageous over other embodiments or designs. Rather, the use of words such as "exemplary" or "such as" is intended to present related concepts in a concrete manner.

In the present disclosure, "at least one" means one or more, and "multiple" means two or more. "And/or" describes an association relationship of associated objects, indicating that there may be three types of relationships. For example, "A and/or B" may indicate: A exists alone, A and B exist at the same time, and B exists alone, where A, B can be singular or plural. The character "l" generally indicates that the object prior to the character and the object after the character are in an "or" relationship. "At least one of the following" or similar expressions refer to any combination of these items, including any combination of single or plural items. For example, at least one of a, b or c may indicate: a; b; c; a combination of a and b; a combination of a and c; a combination of b and c; or a combination of a, b and c, where a, b, c can be single or multiple.

Theoretical research shows that the conversion efficiency of solar cells is restricted by the Shockley-Queisser limit. Single-junction solar cells are solar cells made from absorbing materials with a band gap of 1.34 eV, and have a maximum thermodynamic conversion efficiency of 33.7% for converting solar energy into electrical energy.

When photons with energy higher than the band gap of the absorption layer irradiate the absorption layer of the solar cell, electrons with an energy level higher than the conduction band minimum (CBM) and holes with an energy level lower than the valance band maximum (VBM) will be generated in the absorption layer. Such electrons and holes are collectively referred to as hot carriers. If the hot carriers are collected and exported to an external circuit before being cooled, it can break through the restriction of the Shockley-Queisser limit and obtain solar cells with high efficiency, which are hot carrier solar cells. In theory, the energy conversion efficiency of hot carrier solar cells is predicted to reach more than 66%. In a hot carrier solar cell, after hot electrons and hot holes are generated in the absorption layer, an energy selective contact layer is needed to export the hot carriers in the absorption layer.

As shown in FIG. 1, the energy selective contact of hot carrier solar cells is illustrated by taking the energy selective contact of hot electrons as an example. Hot electrons that are in the conduction band and have not been cooled, before being cooled to the conduction band minimum (CBM), are directly exported from the absorption layer 11 through energy selective contact, stably transported in the energy selective contact layer, and then exported to the external circuit through an electrode. The energy conversion of the hot carrier solar cell is completed in this process. The energy selective contact in FIG. 1 needs to meet the following conditions: 1. the conduction band minimum of the energy selective contact layer needs to be greater than the conduction band minimum (CBM abs) of the absorption layer 11; 2. a width of the conduction band of the energy selective contact layer is narrow, which can only allow hot electrons with energy in the range of $\Delta E_e$ to pass through. At this time, the energy selection range of the energy selective contact layer is $\Delta E_e$. Hot electrons with energies above and below $\Delta E_e$ cannot enter the energy selective contact layer and are elastically scattered back into the absorption layer 11. If hot electrons with energy lower than $\Delta E_e$ enter the hot electron energy selective contact layer, the average energy of the hot electrons in the selective contact layer will be lowered, which is unfavorable to the efficiency of the hot carrier solar cell. If hot electrons with energy higher than $\Delta E_e$ enter the hot electron energy selective contact layer, they will still relax to the lattice temperature of the hot electron energy selective contact layer, resulting in energy waste of hot electrons. After being reflected back to the absorption layer 11, the hot electrons above or below the energy selection range of $\Delta E_e$ are energy rearranged through the elastic scattering, and the hot electrons meeting the energy selection range will be collected by the hot electron energy selective contact layer again.

Figure 2:
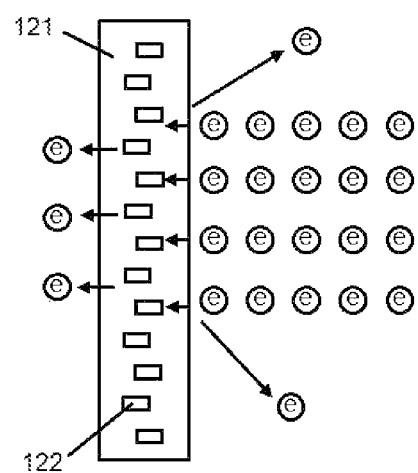
FIG. 2 is a schematic structural diagram illustrating a resonant tunneling energy selective contact layer.

At present, resonant tunneling structures are mainly used to realize energy selective contact. FIG. 2 is a schematic structural diagram illustrating a resonant tunneling energy selective contact layer. A barrier layer 121 in FIG. 2 is generally made from dielectric materials, so that hot electrons cannot pass through the barrier layer. A quantum layer 122 is provided in the barrier layer 121. The quantum layer 122 is generally made from metal or semiconductor materials. Based on the quantum confinement effect, the conduction band of the quantum layer 122 presents discrete energy levels, and only hot electrons with certain energy are allowed to be transported in the quantum layer 122. With the assistance of the quantum layer 122, the hot electrons tunnel into the quantum dots through the tunneling effect, and the discrete energy levels of the quantum dots select the energy of the hot electrons. Hot electrons conforming to the energy selection range defined by the quantum layer 122 pass through the barrier layer 121 through the tunneling effect, thereby realizing the energy selective exportation of the hot electrons in the absorption layer. Hot electrons not conforming to the energy selection range will be scattered back into the absorption layer.

The above energy selective contact layer with a resonant tunneling structure needs to prepare semiconductor or metal quantum dots in a layer of dielectric material, which is hard to produce and difficult to control. Moreover, such energy selective contact layer needs to be prepared through a deposition process, which leads to high equipment costs and low production efficiency.

In order to solve the above technical problems, embodiments of the present disclosure provide a solar cell that can form, through a design of energy selective materials, the energy selective transport of hot carriers in a single material, thus realizing a hot carrier solar cell. In terms of photoelectric conversion materials, the solar cell may be a crystalline silicon solar cell, or a perovskite solar cell, etc. The structure of the solar cell provided by the embodiment of the present disclosure is described below.

Figure 3:
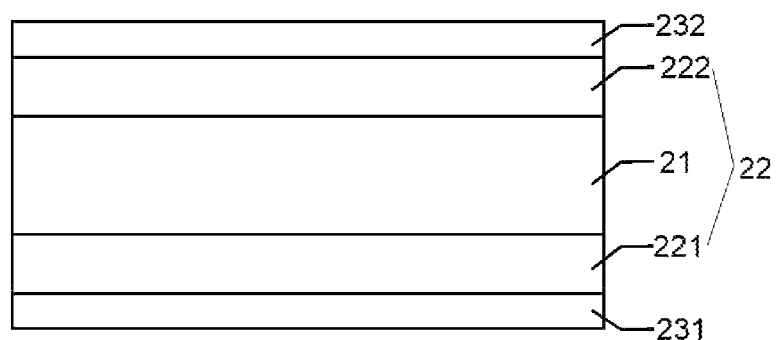
FIG. 3 is a schematic structural diagram illustrating a solar cell provided by an embodiment of the present disclosure.

As shown in FIG. 3, the solar cell includes an absorption layer 21 and an energy selective contact layer 22 disposed on a surface of the absorption layer 21. The material of the absorption layer 21 may be crystalline silicon, perovskite, III-V semiconductor material or organic material, etc. When the solar cell is a hot carrier solar cell, the thickness of the absorption layer 21 is small, thus hot carriers generated in the absorption layer 21 can be transported to the surface of the absorption layer 21 before being cooled to the conduction band minimum. The energy selective contact layer 22 has a selectivity of electron energy or hole energy, and the material of the energy selective contact layer 22 includes a low-dimensional perovskite material.

Figure 4:
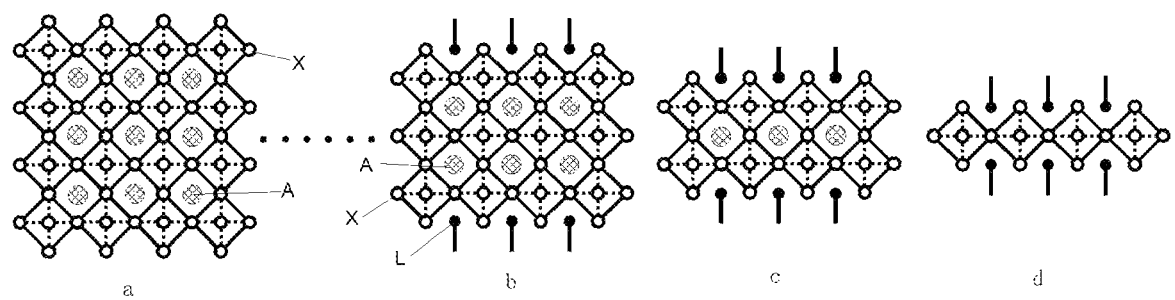
FIG. 4 is a schematic diagram illustrating a transformation process of a perovskite material from a three-dimensional structure to a two-dimensional structure, where 'a' shows a three-dimensional perovskite crystal structure, and 'b', 'c', and 'd' show two-dimensional perovskite crystal structures.

The material of the energy selective contact layer 22 in the embodiment of the present disclosure includes a low-dimensional perovskite material. FIG. 4 is a schematic diagram illustrating a transformation process of a perovskite material from a three-dimensional structure to a two-dimensional structure. As shown in chart a of FIG. 4, the general formula of the perovskite material is $ABX_3$, where A and B are cations, and X is a halogen anion. B ions and X ions form a $[BX_6]^{4-}$ octahedral structure, and multiple octahedral structures are connected at common vertices to form a three-dimensional grid structure, and A ions fill in the gaps between the octahedral structures. The $[BX_6]^{4-}$ octahedral grid as a whole is negatively charged, and the A ion is positively charged, so that the material meets the requirement of electrical neutrality. As shown in chart b of FIG. 4, when some of the A ions are replaced with spacer cations having a large radius, the $[BX_6]^{4-}$ octahedral grid structure becomes unstable and is gradually stretched. As a proportion of spacer cations L gradually increases, the three-dimensional grid gradually evolves into a quasi-two-dimensional structure, as shown in chart b, c of FIG. 4. When the A ions in the three-dimensional perovskite are all replaced with spacer cations L, the three-dimensional perovskite becomes a two-dimensional perovskite material, as shown in chart d in FIG. 4.

Based on the above solar cells, the low-dimensional perovskite material is obtained by introducing spacer cations into the three-dimensional perovskite structure, and the spacer cations confine the octahedral structure to a smaller space, thereby reducing the dimensionality of the perovskite material. At this time, based on the quantum confinement effect, the energy levels of the valence band and the conduction band of the low-dimensional perovskite lattice of the low-dimensional perovskite material split, so that the bandwidth becomes narrow or the energy levels are converted into discrete energy levels. The lower the dimensionality, the more significant the confinement effect. Such low-dimensional perovskite lattice may be used as the quantum layer of the energy selective contact layer 22. The spacer cations of the low-dimensional perovskite material can not only stabilize the low-dimensional perovskite lattice, but also serve as a barrier layer for the energy selective contact layer 22. In this case, the low-dimensional perovskite material is used to form a thin film of a single material, through which the energy selective contact layer 22 with a resonant tunneling structure can be fabricated. The energy selective contact layer 22 with two functions is formed without the cooperation of other materials. In view of this, when the material of the energy selective contact layer 22 includes the low-dimensional perovskite material, the production difficulty of the energy selective contact layer 22 can be greatly reduced, and then the energy selective contact layer 22 can be made relatively easily to improve the production efficiency.

The material of the energy selective contact layer 22 includes the low-dimensional perovskite material. The general chemical formula of the low-dimensional perovskite material is $L_m A_{(n-1)} B_n X_{(3n+m-1)}$, where L is a spacer cation, A and B are both cations, X is an anion; m is 2, 3 or 4, n is an integer greater than or equal to 1.

The ionic radius of the spacer cation L is larger than that of a cesium ion. In this case, the ionic radius of the spacer cation L is large. Such spacer cation with a large ionic radius can better stretch the three-dimensional perovskite structure, and transform the three-dimensional perovskite structure into a low-dimensional perovskite structure with a stable configuration. Preferably, the ionic radius of the spacer cation L is greater than or equal to 200 pm. For example, the ionic radius of the spacer cation L is 200 pm, 250 pm, 300 pm, 500 pm, 600 pm, 700 pm, 1000 pm, etc. The spacer cation L is related to the barrier height of the energy selective contact layer 22. When the ionic radius of the spacer cation L is within this range, the spacer cation L can provide a suitable barrier height for the energy selective contact layer 22.

The above spacer cation L is a monovalent cation. In practical applications, the spacer cation L can be an organic cation. The organic cations include one or more of aromatic amine ions, guanidine ions, and long chain amine ions with 3 or more carbon atoms. These organic cations have large molecular weight and high resistance, and when used as spacer cations, they can provide better insulation performance and provide a barrier layer for the energy selective contact layer 22. Aromatic amine ions may include one or more of phenethylamine ions, anilinium ions, and m-phenylenediamine ions. The long chain amine ion may has a carbon chain length of 4~20 carbon atoms. Specifically, the long chain amine ions may include one or more of n-butylamine ions and n-octylamine ions. In this case, the long chain ammonium ions can not only stably limit the low-dimensional perovskite lattice to a smaller size, but also provide an appropriate barrier height for the energy selective contact layer 22, avoiding an excessively high or low barrier. In practical applications, the spacer cation L included in the energy selective contact layer 22 may be the same type of cation or include multiple types of cations.

The above "A" is one or more of methylamine ions, formamidine ions, and Cs+ ions. "B" is a divalent metal ion such as a lead ion, a tin ion. "X" is a halogen ion.

The value of the above n is related to the size of a quantum dot formed by the low-dimensional perovskite lattice. The larger the n value, the more $[BX_6]^{4-}$ structural units in the low-dimensional perovskite lattice, and the closer the properties of the material are to conventional perovskites. Therefore, in practical applications, $1 \leq n \leq 5$. For example, n may be equal to 1, 2, 3, 4 or 5. When n is within this range, the low-dimensional perovskite lattice has a small size, and can be distributed in the energy selective contact layer in the form of quantum dots. Moreover, the problem that quantum dots in energy selective contact layer cannot be formed due to a large size of low-dimensional perovskite lattice is avoided.

The value of the above "m" is related to the dimensionality of the low-dimensional perovskite material. When m=2, the spacer cation L only splits the crystal structure of the three-dimensional perovskite in the "up and down" direction, that is, only restricts the dimensionality of the perovskite crystal structure in the "up and down" direction, making it a two-dimensional perovskite material, as shown in FIG. 4. In this case, the low-dimensional perovskite material is a two-dimensional perovskite material, and the general chemical formula thereof is $L_2A_{(n-1)}B_nX_{(3n+1)}$. When n=1, the low-dimensional perovskite material is a two-dimensional perovskite material. When 1<n≤5, the low-dimensional perovskite material is a quasi-two-dimensional perovskite material.

When m=3, the number of spacer cations L is further increased relative to the two-dimensional perovskite material. That is to say, on the basis of the two-dimensional perovskite crystal structure, the two-dimensional perovskite crystal structure can be converted into a one-dimensional perovskite crystal structure by further splitting using spacer cations. In this case, the low-dimensional perovskite material is a one dimensional perovskite material, and the general chemical formula thereof is $L_3A_{(n-1)}B_nX_{(3n+2)}$. When n=1, the low-dimensional perovskite material is a one-dimensional perovskite. When 1<n≤5, the low-dimensional perovskite material is a quasi-one-dimensional perovskite material.

When m=4, the number of spacer cations L is further increased relative to the one-dimensional perovskite material. The one-dimensional perovskite crystal structure is further splitted to form a zero-dimensional perovskite crystal structure. In this case, the low-dimensional perovskite material is a zero-dimensional perovskite material, and the general chemical formula thereof is $L_4A_{(n-1)}B_nX_{(3n+3)}$. When n=1, the low-dimensional perovskite material is a zero-dimensional perovskite material. When 1<n≤5, the low-dimensional perovskite material is a quasi-zero-dimensional perovskite material.

In practical applications, the position of the valence band maximum and the conduction band minimum of the low-dimensional perovskite material can be adjusted by controlling the compositions and the proportions thereof of the low-dimensional perovskite material, as well as controlling the values of m and n. Exemplarily, by controlling the proportion of the compositions of the low-dimensional perovskite material, the dimensions of the low-dimensional perovskite material can be precisely controlled (controlling the value of m). The smaller the dimension of the low-dimensional perovskite material, the lower the valence band maximum and the higher the conduction band minimum of the low-dimensional perovskite material. When the value of m is determined, the smaller the value of n, the smaller the size of the low-dimensional perovskite lattice, the lower the valence band maximum and the higher the conduction band minimum of the low-dimensional perovskite material. By adjusting the material selection of the spacer cation L of the low-dimensional perovskite material, the barrier height of the energy selective contact layer 22 made from the low-dimensional perovskite material can be adjusted. By adjusting the proportions of B and X, the valence band maximum and conduction band minimum of the low-dimensional perovskite material can also be adjusted. When the content of B in the low-dimensional perovskite material is greater than that of X, both the valence band maximum and the conduction band minimum of the low-dimensional perovskite material are reduced. When the content of B in the low-dimensional perovskite material is less than that of X, both the valence band maximum and the conduction band minimum of the low-dimensional perovskite material are increased. Of course, it should be noted that B:X=(0.9~4):(1~0.9).

It should be understood that in practical applications, according to the above general chemical formula of the low-dimensional perovskite, low-dimensional perovskite materials that meet the requirements of the electron energy selective contact layer 221 and the hole energy selective contact layer 222 can be prepared by the wet chemical method. The energy level of the conduction band minimum of the low-dimensional perovskite material for making the electron energy selective contact layer 221 is greater than the energy level of the conduction band minimum of the absorption layer 21. The energy level of the valence band maximum of the low-dimensional perovskite material for making the hole energy selective contact layer 222 is less than the energy level of the conduction band minimum of the absorption layer 21.

As shown in FIG. 3, the thickness of the energy selective contact layer 22 including the low-dimensional perovskite material may be 10 nm to 200 nm. For example, the thickness of the energy selective contact layer can be 10 nm, 30 nm, 40 nm, 50 nm, 70 nm, 100 nm, 120 nm, 130 nm, 150 nm, 180 nm, 200 nm, etc. In this case, the energy selective contact layer 22 can stably export electrons or holes to the external circuit.

The energy selective contact layer 22 may be prepared through a coating process or a printing process. The coating process can be a spin coating process, a scrape coating process, a dipping coating process, a spraying coating process etc. When the energy selective contact layer 22 is made, a single material is used, and the energy selective contact layer is made only by preparing a solution for coating or printing. Therefore, the production difficulty and cost are low. Compared with the related art where two materials are used to make the energy selective contact layer 22 of the resonant tunneling structure through the deposition process, not only the process difficulty is reduced, but also the cost is reduced, thereby improving the production efficiency.

The above-mentioned solar cell may include one energy selective contact layer 22, or may include two energy selective contact layers 22.

When the solar cell includes one energy selective contact layer 22, the energy selective contact layer 22 may be the electron energy selective contact layer 221 or the hole energy selective contact layer 222. In this case, the energy selective contact layer 22 of the embodiment of the present disclosure is provided on a first side of the absorption layer 21 to export hot electrons or hot holes. A conventional carrier transport layer may be provided on a second side of the absorption layer 21 to export conventional carriers. Of course, to export hot carriers, the second side of the absorption layer 21 may also be provided with an energy selective contact layer 22 in the related art that is formed by inlaying two materials.

As shown in FIG. 3, when the solar cell includes two energy selective contact layers 22 described above, the two energy selective contact layers 22 are electron energy selective contact layer 221 and hole energy selective contact layer 222 respectively. The electron energy selective contact layer 221 is located on one side of the absorption layer 21, and the hole energy selective contact layer 222 is located on the other side of the absorption layer 21, thereby realizing the energy selective transport of hot electrons and hot holes. Alternatively, the electron energy selective contact layer 221 and the hole energy selective contact layer 222 may also be located on the same side of the absorption layer 21 in a patterned manner.

As shown in FIG. 3, the solar cell may further include a first electrode 231 and a second electrode 232. Taking the solar cell including two energy selective contact layers 22 as an example, the first electrode 231 is disposed on a surface of the electron energy selective contact layer 221 facing away from the absorption layer 21. The second electrode 232 is disposed on a surface of the hole energy selective contact layer 222 facing away from the absorption layer 21. The first electrode 231 and the second electrode 232 may be metal electrodes, transparent electrodes, or carbon electrodes. Moreover, at least one of the first electrode 231 and the second electrode 232 is a transparent electrode.

In the manufacturing process of the above solar cell, except that the energy selective contact layer is made through the wet chemical method, other structures can be made by conventional methods.

Embodiments of the present disclosure further provide a photovoltaic module including the solar cell described above. For the beneficial effects of the photovoltaic module, reference may be made to the beneficial effects of the solar cell, and no further details are given here.

In order to further describe the solar cell in detail, examples of the present disclosure also provide specific examples of the solar cell.

Example I

In the solar cell in this example, the absorption layer is made from monocrystalline silicon material. The hole transport layer is made from NiO material. The electron transport layer is an energy selective contact layer (the electron energy selective contact layer), and is made from a two-dimensional perovskite material. The first electrode and the second electrode are silver electrodes.

The two-dimensional perovskite material of the electron energy selective contact layer adopts the two-dimensional perovskite material $PEA_2PbI_4$ (n=1), and uses the $PEA^+$ (phenylethylamine) ion as the spacer cation. The energy level of the conduction band minimum (CBM) of the two-dimensional perovskite material is −3.51 eV, and the energy level of the conduction band minimum (CBM) of single crystal silicon is −5.0 eV.

A 50 nm thick film made from the two-dimensional perovskite material $PEA_2PbI_4$ was prepared through the spin coating process, and used as the electron energy selective contact layer.

Example II

In the solar cell in this example, the absorption layer is made from the perovskite material FAPbI3. The hole transport layer is made from Spiro-OMeTAD. The electron transport layer is an energy selective contact layer (the electron energy selective contact layer), and made from a one-dimensional perovskite material. The first electrode is made from tin-doped oxyfluoride (FTO). The second electrode is a silver electrode.

The one-dimensional perovskite material of the electron energy selective contact layer is $BAPEA_2PbI_5$ (n=1), n-butylamine ion ($BA^+$) together with $PEA^+$ (phenylethylamine) ion is used as the spacer ion, and a ratio thereof is 1:2. Based on the quantum confinement effect, the CBM of $BAPEA_2PbI_5$ is greater than that of $PEA_2PbI_4$ in Example 1, and the CBM of the $FAPbI_3$ perovskite material is −4.0 eV. As can be seen that the CBM of the electron energy selective contact layer is larger than that of the absorption layer.

A thin film that is made from the one-dimensional perovskite $BAPEA_2PbI_5$ and has a thickness of 60 nm was prepared through the scrape coating process, and used as the electron energy selective contact layer.

Example III

The solar cell in this example is basically the same as the solar cell in Example II, the difference is that a thin film with a thickness of 40 nm is formed by a zero-dimensional perovskite material $Cs_4PbI_6$ (n=1), and used as the electron energy selective contact layer. The CBM of $Cs_4PbI_6$=−2.95 eV, which is greater than that of the absorption layer.

Example IV

The solar cell in this example is an improvement of the solar cell structure in Example I. The improvement lies in that the hole transport layer is also configured as an energy selective contact layer (the hole energy selective contact layer).

The hole energy selective contact layer adopts two-dimensional perovskite material $BA_2PbI_{3.9}$ (n=1), and $BA^+$ is used as the spacer ion. The energy level of the valence band maximum (VBM) of the two-dimensional perovskite material is −5.9 eV, and the VBM of the $FAPbI_3$ perovskite absorption layer is −5.4 eV.

According to the solar cells of the above Examples I to IV, the energy selective contact layer can be prepared by the wet chemical method, thereby avoiding the problem that the existing energy selective contact layer based on the quantum resonant tunneling structure has a complex structure and high manufacturing difficulty.

Although the present disclosure has been described in conjunction with various embodiments herein, those skilled in the art can understand and realize other variations of embodiments of the disclosure by referring to the drawings, the disclosure, and the appended claims during the implementation of the claimed disclosure. In the claims, the word "comprising" does not exclude other components or steps, and "a" or "an" does not exclude plural situations. Certain measures are recited in mutually different dependent claims, which does not mean that these measures cannot be combined to bring advantages.

Although the present disclosure has been described in conjunction with specific features and embodiments, it will be apparent that various modifications and combinations can be made without departing from the spirit and scope of the present disclosure. Accordingly, the specification and drawings are merely illustrative of the disclosure as defined by the appended claims, and are deemed to cover any and all modifications, variations, combinations or equivalents within the scope of this disclosure. Apparently, those skilled in the art can make various changes and modifications to the present disclosure without departing from the spirit and scope of the present disclosure. Thus, if these modifications and variations of the present disclosure fall within the scope of the claims of the present disclosure and equivalent technologies thereof, the present disclosure also intends to include these modifications and variations.

The invention claimed is:
1. A solar cell, comprising:
an absorption layer; and
an energy selective contact layer disposed on a surface of the absorption layer, wherein the energy selective contact layer has a selectivity for electron energy or hole energy;
wherein a material of the energy selective contact layer comprises a low-dimensional perovskite material;
wherein a general chemical formula of the low-dimensional perovskite material is $LmA_{(n-1)}B_nX_{(3n+m-1)}$, L is a spacer cation, A and B are both cations, X is an anion, and m is 3 or 4, n is an integer greater than or equal to 1;

wherein an ionic radius of the spacer cation L is greater than the ionic radius of a cesium ion;

wherein, when m=3, the low-dimensional perovskite material is a one-dimensional perovskite material having a general chemical formula $L_3A_{(n-1)}B_nX_{(3n+2)}$; and when n=1, the low-dimensional perovskite material is a one-dimensional perovskite; when 1<n≤5, the low-dimensional perovskite material is a quasi-one-dimensional perovskite material; or when m=4, the low-dimensional perovskite material is a one-dimensional perovskite material having a general chemical formula $L_4A_{(n-1)}B_nX_{(3n+3)}$; and when n=1, the low-dimensional perovskite material is a zero-dimensional perovskite material; when 1<n≤5, the low-dimensional perovskite material is a quasi-zero-dimensional perovskite material.

2. The solar cell according to claim 1, wherein the ionic radius of the spacer cation L is greater than or equal to 200 pm.

3. The solar cell according to claim 1, wherein the spacer cation L is an organic cation, and the organic cation comprises one or more of an aromatic amine ion, a guanidine ion, and a long chain amine ion with a carbon number greater than or equal to 3.

4. The solar cell according to claim 3, wherein the aromatic amine ion comprises one or more of a phenethylamine ion, an anilinium ion, and a m-phenylenediamine ion.

5. The solar cell according to claim 3, wherein the long chain amine ion has a carbon chain length of 4-20 carbon atoms.

6. The solar cell according to claim 5, wherein the long chain amine ion comprises one or more of a n-butylamine ion and a n-octylamine ion.

7. The solar cell according to claim 1, wherein at least one of the following is met:

1≤n≤5, and

A is one or more of a methylamine ion, a formamidine ion, and $Cs^+$ ion; B is a divalent metal ion; X is a halogen ion.

8. The solar cell according to claim 1, wherein the material of the absorption layer is crystalline silicon, perovskite, III-V semiconductor material or organic material.

9. The solar cell according to claim 1, wherein the solar cell comprises two energy selective contact layers, and the two energy selective contact layers are an electron energy selective contact layer and a hole energy selective contact layer respectively.

10. The solar cell according to claim 9, wherein the absorption layer comprises a first surface and a second surface opposite to each other, the electron energy selective contact layer is disposed on the first surface of the absorption layer, the hole energy selective contact layer is disposed on the second surface of the absorption layer; and a first electrode is disposed on the electron energy selective contact layer facing away from the first surface of the absorption layer, a second electrode is disposed on the hole energy selective contact layer facing away from the second surface of the absorption layer, wherein the first electrode and the second electrode are any one of a metal electrode, a transparent electrode or a carbon electrode and a combination thereof, and at least one of the first electrode and the second electrode is a transparent electrode.

11. The solar cell according to claim 1, wherein the energy selective contact layer is manufactured through a coating process or a printing process.

12. The solar cell according to claim 1, wherein a thickness of the energy selective contact layer is 10 nm to 200 nm.

13. A photovoltaic module comprising a solar cell, wherein the solar cell comprises:

an absorption layer; and an energy selective contact layer disposed on a surface of the absorption layer, wherein the energy selective contact layer has a selectivity for electron energy or hole energy;

wherein a material of the energy selective contact layer comprises a low-dimensional perovskite material;

wherein a general chemical formula of the low-dimensional perovskite material is $LmA_{(n-1)}B_nX_{(3n+m-1)}$, L is a spacer cation, A and B are both cations, X is an anion, and m is 3 or 4, n is an integer greater than or equal to 1;

wherein an ionic radius of the spacer cation L is greater than the ionic radius of a cesium ion;

wherein, when m=3, the low-dimensional perovskite material is a one-dimensional perovskite material having a general chemical formula $L_3A_{(n-1)}B_nX_{(3n+2)}$; and when n=1, the low-dimensional perovskite material is a one-dimensional perovskite; when 1<n≤5, the low-dimensional perovskite material is a quasi-one-dimensional perovskite material; or when m=4, the low-dimensional perovskite material is a one-dimensional perovskite material having a general chemical formula $L_4A_{(n-1)}B_nX_{(3n+3)}$; and when n=1, the low-dimensional perovskite material is a zero-dimensional perovskite material; when 1<n≤5, the low-dimensional perovskite material is a quasi-zero-dimensional perovskite material.

* * * * *